United States Patent
Lin et al.

(10) Patent No.: US 9,558,841 B2
(45) Date of Patent: Jan. 31, 2017

(54) GENERATING STABILIZED OUTPUT SIGNALS DURING FUSE READ OPERATIONS

(71) Applicant: TAIWAN SEMICONDUCTOR MANUFACTURING COMPANY, LTD., Hsinchu County (TW)

(72) Inventors: Sung-Chieh Lin, Zhubei (TW);
Kuo-Yuan Hsu, San Jose, CA (US);
Wei-Li Liao, Taichung (TW);
Chen-Ming Hung, Zhubei (TW);
Yun-Han Chen, Chiayi (TW);
Shao-Cheng Wang, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 347 days.

(21) Appl. No.: 13/918,681

(22) Filed: Jun. 14, 2013

(65) Prior Publication Data
US 2014/0369105 A1 Dec. 18, 2014

(51) Int. Cl.
*G11C 17/16* (2006.01)
*G11C 17/18* (2006.01)

(52) U.S. Cl.
CPC .............. *G11C 17/16* (2013.01); *G11C 17/18* (2013.01)

(58) Field of Classification Search
CPC ................................. G11C 17/16; G11C 17/18
USPC ................................. 365/225.7, 189.07, 205
See application file for complete search history.

(56) References Cited

U.S. PATENT DOCUMENTS

| | | | |
|---|---|---|---|
| 6,346,845 B1 * | 2/2002 | Choi ...................... | G11C 17/18 327/525 |
| 7,477,555 B2 * | 1/2009 | Anand ................... | G11C 17/16 365/196 |
| 2008/0002451 A1 * | 1/2008 | Anand ................... | G11C 17/18 365/96 |
| 2014/0022004 A1 * | 1/2014 | Luo ........................ | H01L 23/62 327/525 |

* cited by examiner

*Primary Examiner* — Richard Elms
*Assistant Examiner* — Jerome Leboeuf
(74) *Attorney, Agent, or Firm* — McDermott Will & Emery LLP

(57) ABSTRACT

A circuit includes a fuse cell, a sense circuit and an output control circuit. The fuse cell includes an electrical fuse. The sense circuit is electrically coupled to the fuse cell and configured for generating a sense signal indicative of a programmed condition of the electrical fuse, at an output of the sense circuit. The output control circuit is electrically coupled to the output of the sense circuit, and the output control circuit is configured for latching the sense signal indicative of the electrical fuse having been programmed, during a read operation of the fuse cell.

18 Claims, 6 Drawing Sheets

GENERATING STABILIZED OUTPUT SIGNALS DURING FUSE READ OPERATIONS

FIELD

The present disclosure relates to generating an output signal during the read operation.

BACKGROUND

In integrated circuits (ICs), electrical fuses are designed to be programmed (or blown) when the electrical fuses are used. An IC occasionally includes a number of electrical fuses, and a sense circuit is implemented in the IC to detect a sensing current flowing through a selected electrical fuse and outputs a corresponding output signal (e.g., a read signal).

However, there is parasitic capacitance in circuits of the sense amplifier. As a result, when the sense amplifier generates the output signal during an operation, the output signal is unstable, e.g., oscillates, due to the parasitic capacitance, resulting in an incorrect output signal.

BRIEF DESCRIPTION OF THE DRAWINGS

The disclosure can be more fully understood by reading the following detailed description of various embodiments, with reference to the accompanying drawings as follows.

DETAILED DESCRIPTION

In the following description, specific details are presented to provide a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
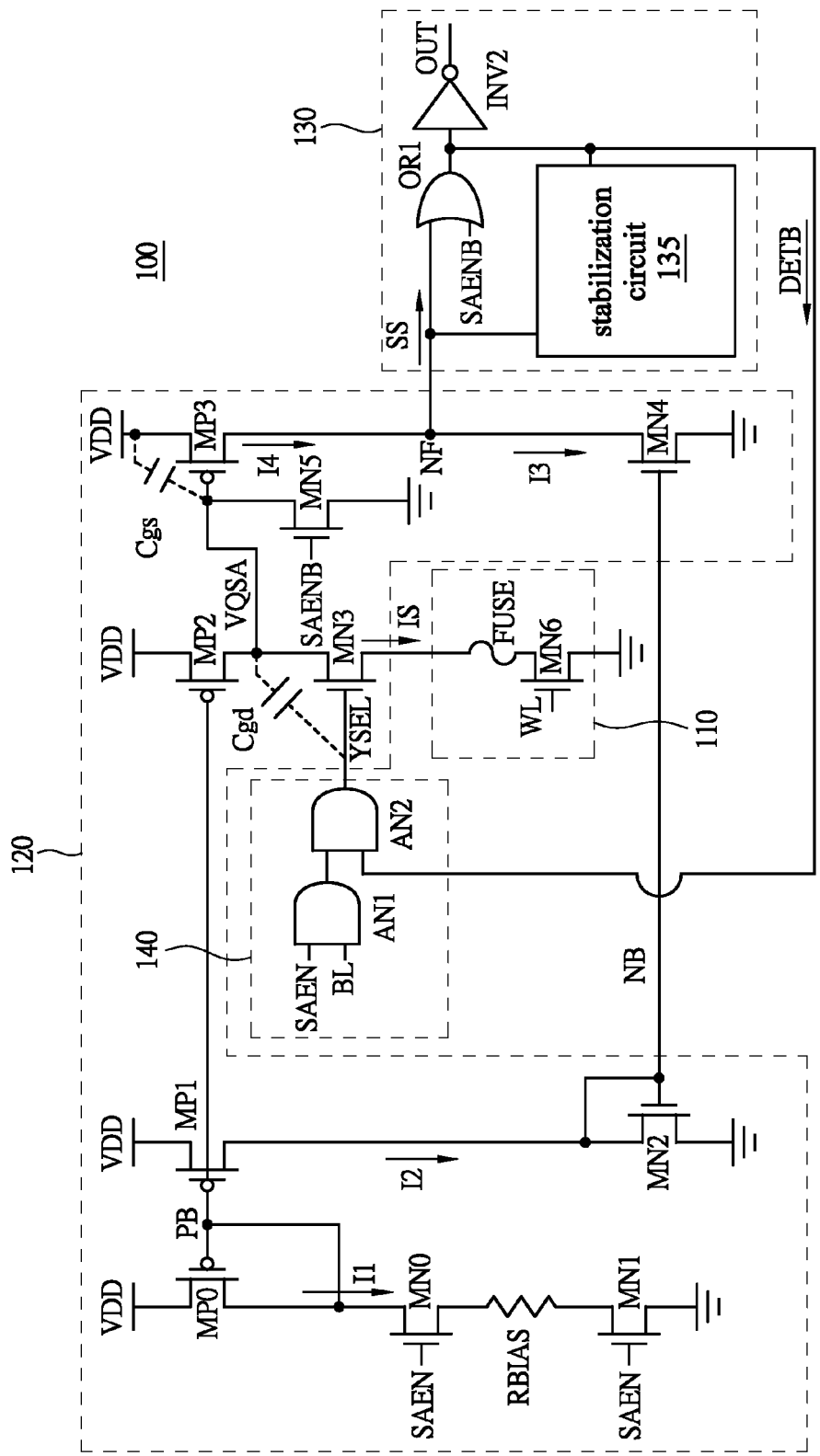
FIG. 1 is a schematic diagram of an integrated circuit in accordance with some embodiments of the present disclosure.

FIG. 1 is a schematic diagram of an integrated circuit (IC) 100 in accordance with some embodiments of the present disclosure.

The fuse cell 110 includes an electrical fuse FUSE and a transistor MN6 such as an NMOS transistor. In some embodiments, the electrical fuse FUSE is an electrical fuse in an array of electrical fuses (not shown). Further, the transistor MN6 has a gate configured for receiving a word line signal WL, a drain coupled to the electrical fuse FUSE, and a source coupled to a reference voltage VSS (not labeled), which, in some embodiments, is ground.

When the fuse cell 110 is selected, MN6 is turned on by the word line signal WL. As a result, the current IS flows through the electrical fuse FUSE and MN6.

In some embodiments, when the electrical fuse FUSE is not programmed, the resistance of the electrical fuse FUSE is relatively low. For example, the resistance of the electrical fuse FUSE is equal to or smaller than 100Ω. In contrast, when the electrical fuse FUSE is programmed, the resistance of the electrical fuse FUSE is relatively high. For example, the resistance of the electrical fuse FUSE is equal to or greater than 10 KΩ.

The sense circuit 120 is coupled to the fuse cell 110. The sense circuit 120 is configured for generating a sense signal SS indicative of a programmed condition of the electrical fuse FUSE, at an output node NF of the sense circuit 120. For illustration, the electrical fuse FUSE has been programmed. Therefore, the sense signal SS is indicative of the electrical fuse FUSE having been programmed.

As illustrated in FIG. 1, the sense circuit 120 includes transistors MP0-MP3, MN0-MN5 and a resistance RBIAS. In some embodiments, the transistors MP0-MP3 are PMOS transistors, the transistors MN0-MN6 are NMOS transistors, and the resistance RBIAS includes a resistor.

The transistor MP0 has a gate and a drain coupled with each other and to the transistor MN0, and a source coupled to a power supply VDD. The transistor MP1 has a gate coupled to the gate of the transistor MP0, a source coupled to the power supply VDD, and a drain coupled to the transistor MN2. The transistors MP0 and MP1 operate together as a current mirror.

The transistor MP2 has a gate coupled to the gate of the transistor MP0, a source coupled to the power supply VDD, and a drain coupled to the transistor MN3. The transistors MP0 and MP2 operate together as a current mirror.

The transistor MP3 has a gate coupled to the drain of the transistor MP2, a source coupled to the power supply VDD, and a drain coupled to the transistor MN5.

The transistor MN0 has a gate configured for receiving a control signal SAEN, a drain coupled to the drain of the transistor MP0, and a source coupled to one terminal of the resistance RBIAS.

The transistor MN1 has a gate configured for receiving the control signal SAEN, a drain coupled to the other terminal of the resistance RBIAS, and a source coupled to ground.

The transistor MN2 has a gate and a drain coupled with each other to the drain of the transistor MP1, and a source coupled to ground.

The transistor MN4 has a gate coupled to the gate of the transistor MN2, a drain coupled to the drain of the transistor MP3, and a source coupled to ground. The transistors MN2 and MN4 operate together as a current mirror.

The transistor MN3 has a gate configured for receiving a selection signal YSEL, a drain coupled to the gate of the transistor MP3 and the drain of the transistor MP2 at a node VQSA, a source coupled to the electrical fuse FUSE.

The transistor MN5 has a gate configured for receiving a control signal SAENB, a drain coupled to the gate of the transistor MP3, and a source coupled to ground.

In some embodiments, the control signal SAEN is configured for enabling the sense circuit 120, and the control signal SAENB is a complementary signal of the control signal SAEN. For illustration, during the read operation of the fuse cell 110, the control signal SAEN is logically high, and the control signal SAENB is logically low.

The output control circuit 130 is coupled to the output node NF of the sense circuit 120. The output control circuit 130 is configured for generating an output signal OUT and a logic signal DETB in response to the sense signal SS. In some embodiments, the output signal OUT is a read signal, and the logic signal DETB is a feedback signal. The output control circuit 130 is also configured for stabilizing the output node NF in response to the sense signal SS.

In the output control circuit 130, the OR gate OR1 has a first input coupled to the node NF, and a second input for receiving the control signal SAENB. The inverter INV2 has an input coupled to the output of the OR gate OR1, and an output for outputting the output signal OUT. The stabilization circuit 135 is coupled to the node NF. The stabilization circuit 135 is configured for pulling the node NF down to ground in response to the logic signal DETB. In some embodiments, the stabilization circuit 135 is a pull-down circuit.

For illustration in FIG. 1, the stabilization circuit 135 is implemented in the output control circuit 130. Other locations of the stabilization circuit 135 are within the contemplated scope of the present disclosure.

The selection circuit 140 is coupled to the transistor MN3. The selection circuit 140 is configured for generating the selection signal YSEL for activating or deactivating the current IS, in response to the control signal SAEN, a bit line signal BL and the logic signal DETB.

In the selection circuit 140, the AND gate AN1 has a first input for receiving the control signal SAEN, and a second input for receiving the bit line signal BL. The AND gate AN2 has a first input coupled to the output of the AND gate AN1, a second input for receiving the logic signal DETB, and an output coupled to the transistor MN3.

Operations of the integrated circuit 100 are explained below with reference to FIG. 2.

Figure 2:
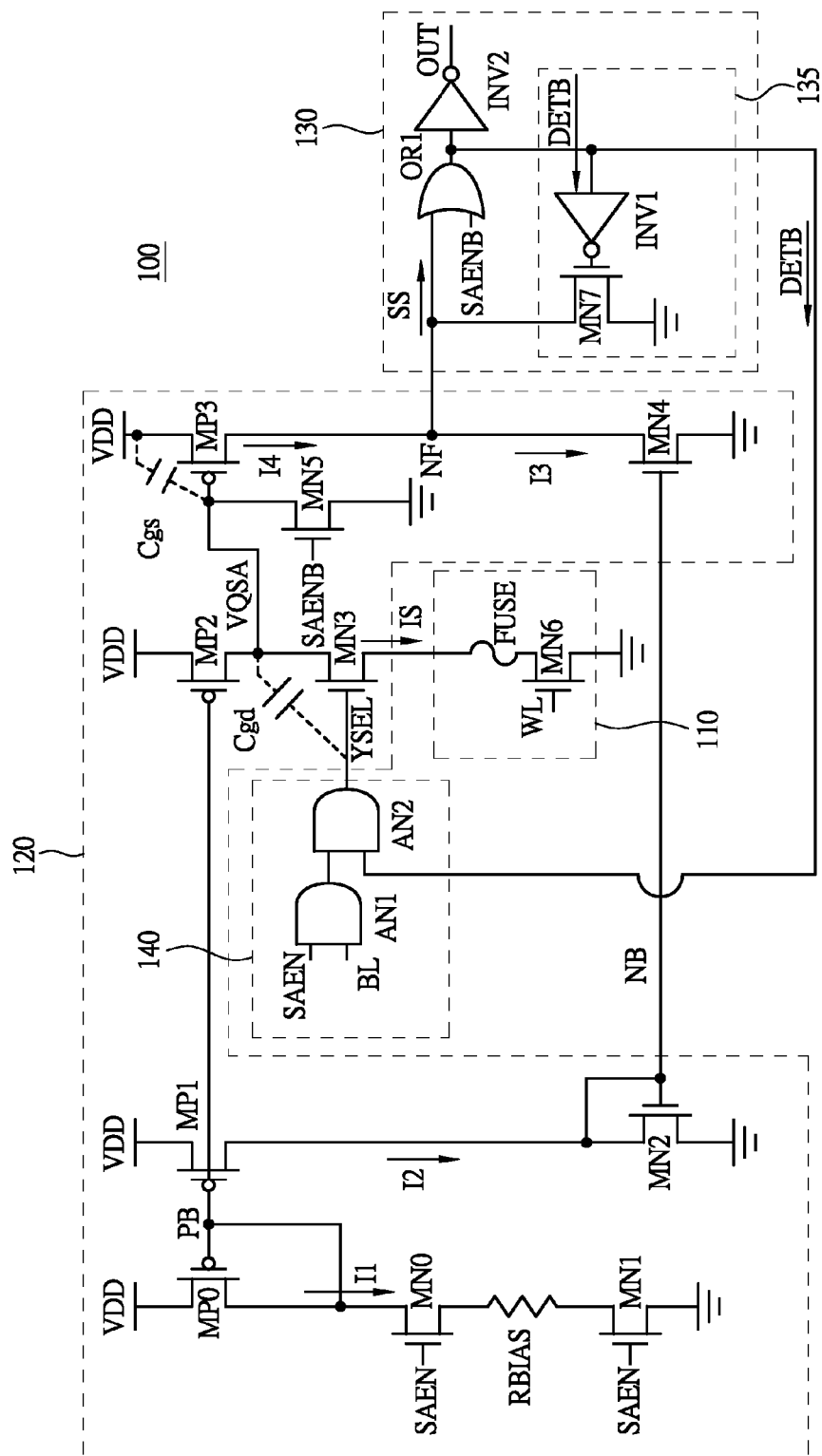
FIG. 2 is a schematic diagram of the integrated circuit in FIG. 1 in accordance with some further embodiments of the present disclosure.

FIG. 2 is a schematic diagram of the integrated circuit 100 having details of the stabilization circuit 135, in accordance with some further embodiments of the present disclosure. FIG. 2 is used to explain operations of the integrated circuit 100 having details of the stabilization circuit 135.

Compared with FIG. 1, the stabilization circuit 135 includes an inverter INV1 and a transistor MN7. In some embodiments, the transistor MN7 is an NMOS transistor. The inverter INV1 has an input for receiving the logic signal DETB. The transistor MN7 has a gate coupled to the output of the inverter INV1, a drain coupled to the node NF, and a source coupled to ground.

The inverter INV1 and the transistor MN7 in FIG. 2 are for illustration. The inverter INV1 and the transistor MN7 that are outside the stabilization circuit 135 are within the contemplated scope of the present disclosure. Moreover, other circuit components used to perform the functions of the stabilization circuit 135 are within the contemplated scope of the present disclosure.

Figure 3:
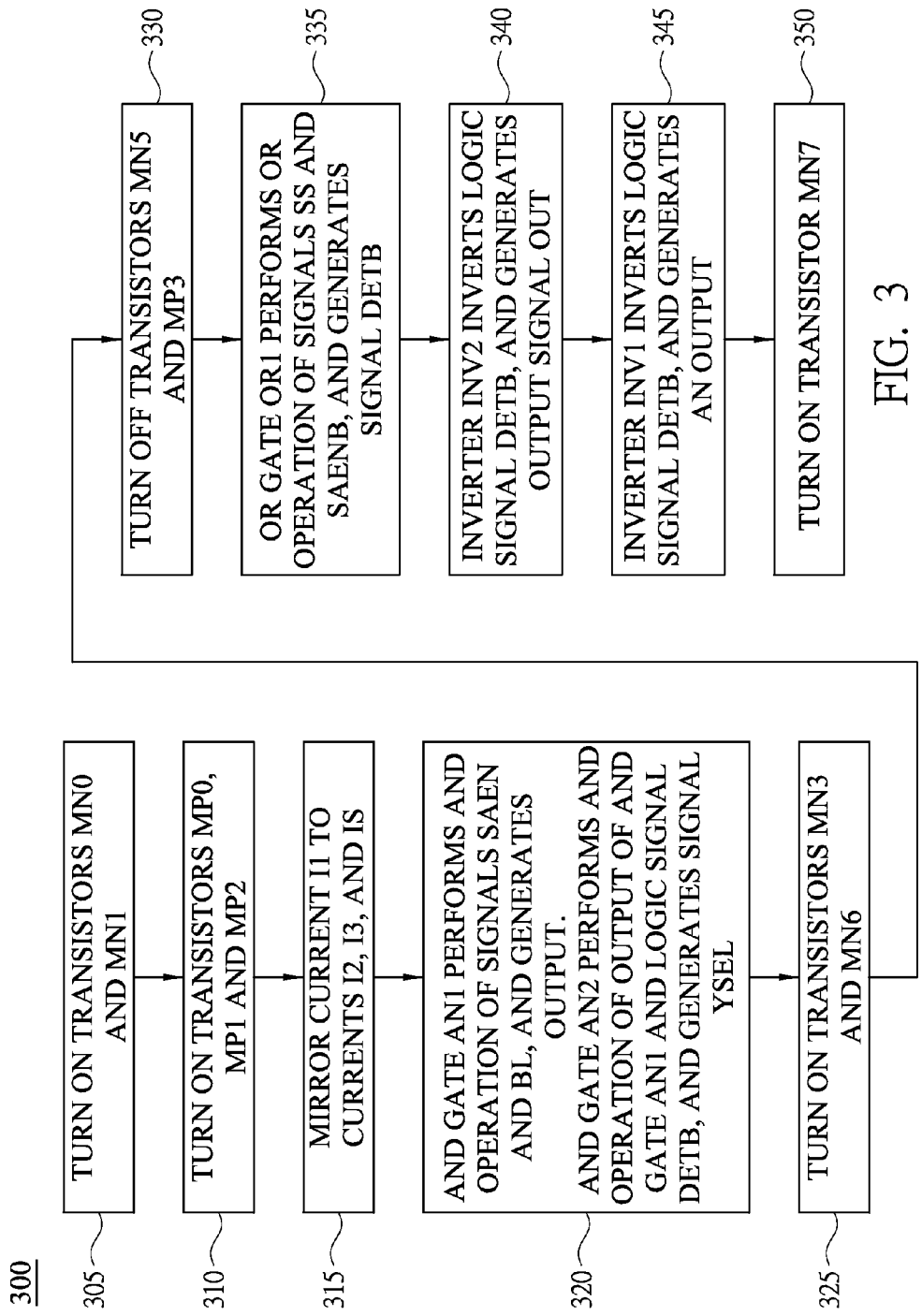
FIG. 3 is a flow chart of a method illustrating operations of the integrated circuit in FIG. 1, in accordance with some embodiments of the present disclosure.

FIG. 3 is a flow chart of a method 300 illustrating operations of the integrated circuit 100 in FIG. 2, in accordance with some embodiments of the present disclosure. For illustration, the operations below are performed during the read operation of the fuse cell 110.

In operation 305, the transistors MN0 and MN1 are turned on by the control signal SAEN. For illustration, the control signal SAEN has a logically high value. As a result, a voltage PB is generated at the gate of the transistor MP0.

In operation 310, the transistors MP0, MP1 and MP2 are turned on by the voltage PB. In some embodiments, the transistors MP0, MN0, and MN1 and the resistance RBIAS operate together as a bias circuit for biasing the transistors MP1 and MP2. As a result, the current I1 is generated and flows through the transistors MP0, MN0 and MN1 and the resistance RBIAS. In some embodiments, the current I1 is determined by setting values of the resistance RBIAS. For example, the resistance RBIAS has a range of resistance values from about 1000 to 1500Ω.

In operation 315, the current I1 is mirrored to the current I2, because the transistors MP0 and MP1 are turned on by the voltage PB and operate together as a current mirror. As a result, the current I2 is substantially equal to the current I1, and flows through the transistors MP1 and MN2.

Furthermore, the current I2 is mirrored to the current I3, because the transistors MN2 and MN4 operate together as another current mirror. As a result, the current I3 is substantially equal to the current I2, and flows through the transistor MN4.

In addition, the current I1 is mirrored to the current IS, because the transistors MP0 and MP2 are turned on by the voltage PB and operate together as yet another current mirror. As a result, the current IS is substantially equal to the current I1.

In operation 320, the AND gate AN1 performs an AND operation of the control signal SAEN and the bit line signal BL, and thus generates an output. Moreover, the AND gate AN2 performs an AND operation of the output of the AND gate AN1 and the logic signal DETB, and thus generates the control signal YSEL.

In operation 325, the transistor MN3 is turned on by the control signal YSEL, and the transistor MN6 is turned on by the word line signal WL. As a result, the current IS is generated and flows through the transistors MP2, MN3, MN6 and the electrical fuse FUSE. The voltage of the node VQSA corresponding to the current IS is therefore generated.

In operation 330, the transistor MN5 is turned off by the control signal SAENB, and the transistor MP3 is turned off by the voltage of the node VQSA. As a result, the node NF is pulled down to ground at the source of the transistor MN4. Effectively, the sense signal SS at the node NF is pulled down to ground, and is effectively generated.

In operation 335, the OR gate OR1 performs an OR operation of the sense signal SS and the control signal SAENB, and thus generates the corresponding logic signal DETB.

In operation 340, the inverter INV2 inverts the logic signal DETB, and thus generates the output signal OUT to, for example, a testing device or other circuitry.

For illustration, the node NF is pulled down to ground, and thus the sense signal SS at the node NF is logically low. As a result, the logic signal DETB, by operation of the OR gate OR1, is logically low, because the sense signal SS and the control signal SAENB are both logically low. Therefore, the output signal OUT is logically high. The condition of the electrical fuse FUSE is sensed by determining the state of the output signal OUT.

In operation 345, the inverter INV1 inverts the logic signal DETB and generates an output having a logical high value.

In operation 350, the transistor MN7 is turned on by the output of the inverter INV1. As a result, the node NF is pulled down to ground at the source of the transistor MN7, and the node NF is stabilized. The sense signal SS at the node NF is therefore latched, which indicates that the sense signal SS remains logically low. The output signal OUT remains logically high.

In some situations without the inverter INV1 and the transistor MN7, the voltage of the node VQSA is unstable due to the coupling capacitance Cgd between the node VQSA and the gate of the transistor MN3. As a result, the transistor MP3 is alternately turned on and off. For example, when the transistor MP3 is turned on, the current I4 is generated and flows through the transistor MP3 to the node NF. The node NF is pulled to the power supply VDD at the source of the transistor MP3. Therefore, the voltage of the node NF changes in accordance with the turn-on and turn-off of the transistor MP3, and the sense signal SS oscillates accordingly.

With the aid of the inverter INV1 and the transistor MN7, the node NF is stabilized because of the operations 345 and 350, as described above. As a result, the sense signal SS does not oscillate, and is stabilized. The output signal OUT corresponding to the sense signal SS is stabilized as well.

Figure 4:
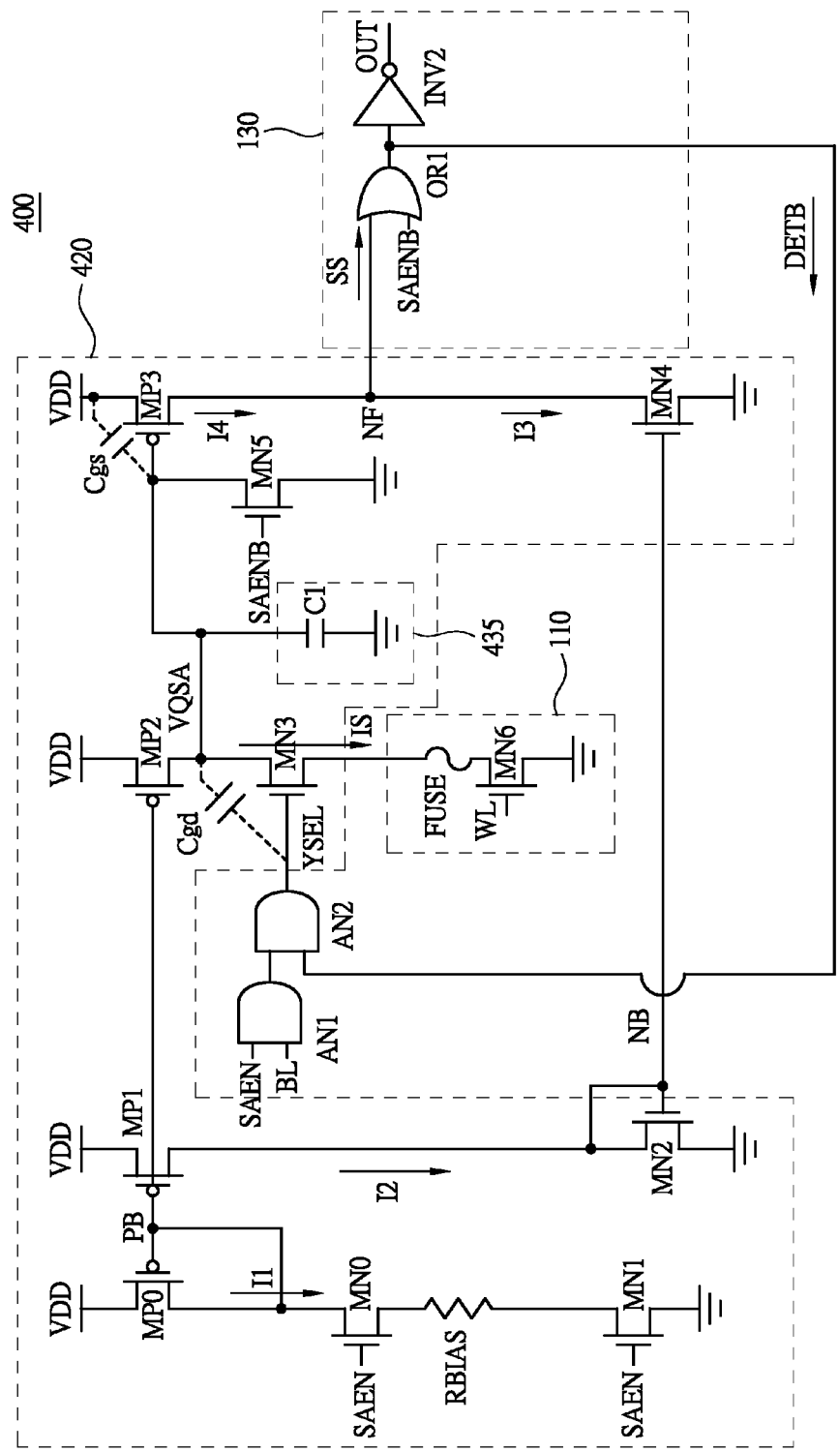
FIG. 4 is a schematic diagram of an integrated circuit in accordance with some other embodiments of the present disclosure.

FIG. 4 is a schematic diagram of an integrated circuit (IC) 400 in accordance with some other embodiments of the present disclosure.

Compared with the integrated circuit 100 in FIG. 1, the output control circuit 430 does not include the stabilization circuit 135, and the integrated circuit 400 includes the stabilization circuit 435. For illustration, the stabilization circuit 435 is implemented in the sense circuit 420. Other locations of the stabilization circuit 435 are within the contemplated scope of the present disclosure.

The stabilization circuit 435 is configured for sustaining a voltage of the node VQSA, during the read operation of the fuse cell 110. In some embodiments, the stabilization circuit 435 includes a capacitive unit C1, which, in some embodiments, is a capacitor. The capacitance C1 is coupled between the node VQSA and ground.

The operations of the integrated circuit 400 are similar to those illustratively shown in FIG. 3, but does not include the operations of the inverter INV1 and the transistor MN7.

Moreover, in operations of the integrated circuit 400, when the transistor MN3 is turned on, the voltage of the node VQSA is generated, and charges the capacitive unit C1. As a result, the capacitive unit C1 sustains the voltage of the node VQSA. The transistor MP3 remains turned off by the voltage of the node VQSA. Accordingly, after the node NF is pulled to ground at the source of the transistor MN4, the node NF remains at the corresponding state. As a result, the sense signal SS is stabilized, and the output signal OUT corresponding to the sense signal SS is stabilized as well.

Figure 5:
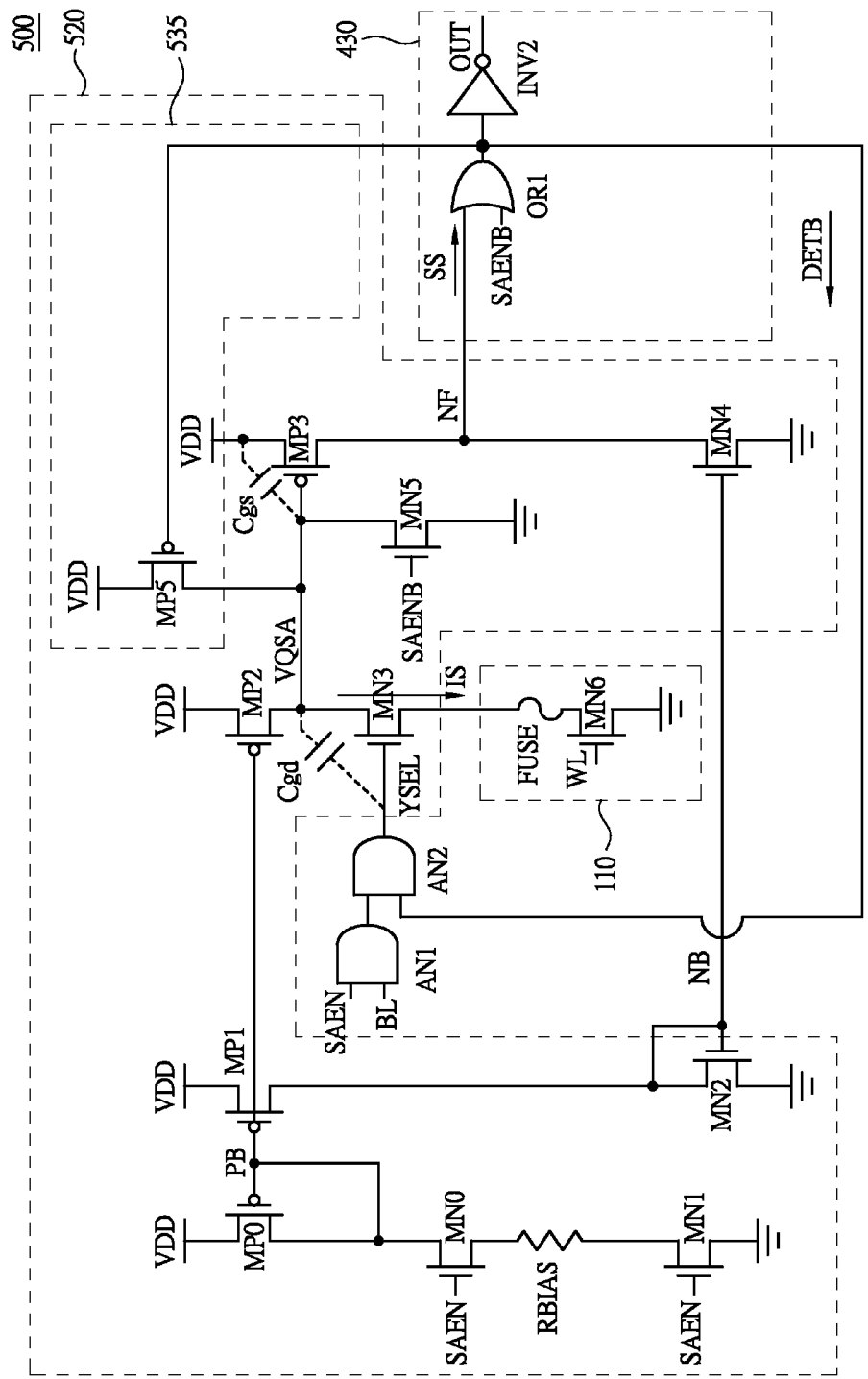
FIG. 5 is a schematic diagram of an integrated circuit in accordance with some yet other embodiments of the present disclosure.

FIG. 5 is a schematic diagram of an integrated circuit (IC) 500 in accordance with some yet other embodiments of the present disclosure.

Compared with the integrated circuit 400 in FIG. 4, the integrated circuit 500 does not include the stabilization circuit 435, but includes the stabilization circuit 535. For illustration, the stabilization circuit 535 is implemented in the sense circuit 520. Other locations of the stabilization circuit 535 are within the contemplated scope of the present disclosure.

The stabilization circuit 535 is configured for pulling the node VQSA up to the power supply VDD, during the read operation of the fuse cell 110. In some embodiments, the stabilization circuit 535 is a pull-up circuit, and includes a transistor MP5 such as a PMOS transistor. The transistor MP5 has a gate configured for receiving the logic signal DETB, a source coupled to the power supply VDD, and a drain coupled to the node VQSA.

The operations of the integrated circuit 500 are similar to those illustratively shown in FIG. 3, but does not include the operations of the inverter INV1 and the transistor MN7.

Moreover, in operations of the integrated circuit 500, the transistor MP5 is turned on by the logic signal DETB. The node VQSA is pulled to the power supply voltage VDD at the source of the transistor MP5. As a result, the transistor MP3 remains turned off by the voltage of the node VQSA. Accordingly, after the node NF is pulled to ground at the source of the transistor MN4, the node NF remains at the corresponding state. As a result, the sense signal SS is stabilized, and the output signal OUT corresponding to the sense signal SS is stabilized as well.

Figure 6:
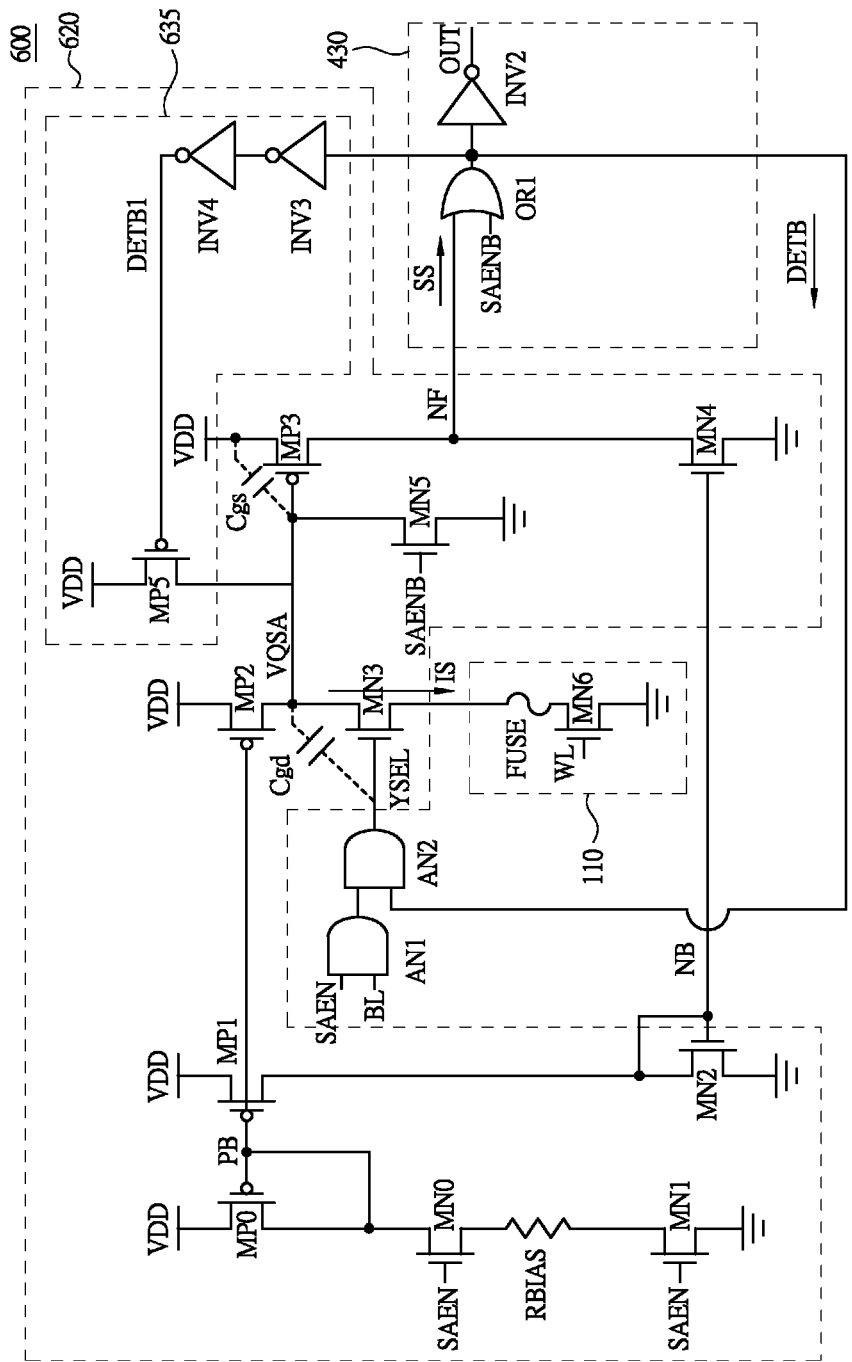
FIG. 6 is a schematic diagram of an integrated circuit in accordance with some further embodiments of the present disclosure.

FIG. 6 is a schematic diagram of an integrated circuit (IC) 600 in accordance with some further embodiments of the present disclosure.

Compared with the integrated circuit 500 in FIG. 5, the stabilization circuit 635 in the sense circuit 620 further includes inverters INV3 and INV4. The inverter INV3 has an input configured for receiving the logic signal DETB. The inverter INV4 has an input configured for receiving an output of the inverter INV3, and an output configured for generating a logic signal DETB1. The gate of the transistor MP5 is coupled to the output of the inverter INV4 and receives the logic signal DETB1.

Compared with the stabilization circuit 535 in FIG. 5, the inverters INV3 and INV4 operate together as a buffer, for buffering the logic signal DETB to generate the logic signal DETB1. As a result, the transistor MP5 is ensured to be turned on by the logic signal DETB1.

The stabilization circuits in FIG. 2, FIG. 4, FIG. 5 and FIG. 6 are separately illustrated. Any combination of the stabilization circuits in FIG. 2, FIG. 4, FIG. 5 and FIG. 6 is within the contemplated scope of the present disclosure.

The above illustrations include exemplary operations, but the operations are not necessarily performed in the order shown. Operations may be added, replaced, changed order, and/or eliminated as appropriate, in accordance with the spirit and scope of various embodiments of the present disclosure.

The aforementioned resistance RBIAS including one or more resistive devices including resistors connected in series and/or parallel is within the contemplated scope of the present disclosure. Similarly, the aforementioned capacitive unit C1 including one or more capacitive devices including capacitors connected in series and/or parallel is also within the contemplated scope of the present disclosure.

In the descriptions and claims, the term "coupled" may also be termed as "electrically coupled", and the term "connected" may be termed as "electrically connected". "Coupled" and "connected" may also be used to indicate that two or more elements cooperate or interact with each other.

A circuit is disclosed that includes a fuse cell, a sense circuit and an output control circuit. The fuse cell includes an electrical fuse. The sense circuit is electrically coupled to the fuse cell and is configured for generating a sense signal indicative of a programmed condition of the electrical fuse, at an output of the sense circuit. The output control circuit is electrically coupled to the output of the sense circuit, and the output control circuit is configured for latching the sense signal indicative of the electrical fuse having been programmed, during a read operation of the fuse cell.

Also disclosed is a circuit including a fuse cell, a sense circuit and a stabilization circuit. The fuse cell includes an electrical fuse. The sense circuit is coupled to the fuse cell at an operation node on which data stored in the fuse cell is reflected and configured for generating a sense signal indicative of a programmed condition of the electrical fuse, at an output of the sense circuit. The stabilization circuit is configured for sustaining a voltage of the operation node, during a read operation of the fuse cell.

A method is also disclosed in which a sense signal indicative of a programmed condition of the electrical fuse is generated at an output of a sense circuit, and the sense signal indicative of the electrical fuse having been programmed is latched during a read operation of the fuse cell.

A method is further disclosed in which a sense signal indicative of a programmed condition of an electrical fuse in a fuse cell is generated at an output of a sense circuit, and a voltage of an operation node at which the sense circuit is electrically coupled to the fuse cell and data stored in the fuse cell is reflected is sustained during a read operation of the fuse cell.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit comprising:
    a fuse cell comprising an electrical fuse;
    a sense circuit electrically coupled to the fuse cell at an operation node on which data stored in the fuse cell is reflected and configured for generating a sense signal indicative of a programmed condition of the electrical fuse, at an output of the sense circuit;
    a logic gate configured to perform a logic operation of the sense signal and a control signal to generate a logic signal; and
    a stabilization circuit configured to be controlled by the logic signal to sustain a voltage of the operation node, during a read operation of the fuse cell.

2. The circuit of claim 1, wherein the stabilization circuit comprises:
    a pull-up unit configured for pulling the operation node up to a supply voltage.

3. The circuit of claim 1, wherein the stabilization circuit comprises:
    a first inverter having an input configured for receiving the logic signal corresponding to the sense signal;
    a second inverter having an input configured for receiving an output of the first inverter, and an output configured for generating a second logic signal; and
    a transistor having a control terminal configured for receiving the second logic signal, a first terminal electrically coupled to a supply voltage, and a second terminal electrically coupled to the operation node.

4. The circuit of claim 3, further comprising:
    a third inverter configured for receiving the logic signal and generating an output signal,
    wherein the logic gate comprises an OR gate, and the OR gate is configured to receive the sense signal and the control signal and configured to generate the logic signal.

5. The circuit of claim 1, wherein the stabilization circuit further comprises:
    a transistor having a control terminal configured for receiving a logic signal corresponding to the sense signal, a first terminal electrically coupled to a supply voltage, and a second terminal electrically coupled to the operation node.

6. The circuit of claim 5, further comprising:
    an inverter configured for receiving the logic signal and generating an output signal,
    wherein the logic gate comprises an OR gate, and the OR gate is configured to receive the sense signal and the control signal and configured to generate the logic signal.

7. The circuit of claim 1, further comprising:
    a selection circuit configured for generating a selection signal activating or deactivating a sense current flowing through the fuse cell in response to a first control signal, a data signal and the logic signal corresponding to the sense signal.

8. The circuit of claim 7, wherein the selection circuit comprises:
    a first AND gate configured for receiving the first control signal and the data signal; and
    a second AND gate configured for receiving an output of the first AND gate and the logic signal to generate the selection signal for activating or deactivating the sense current flowing through the fuse cell.

9. The circuit of claim 1, wherein the fuse cell comprises:
    a transistor having a control terminal configured for receiving a control signal, a first terminal electrically coupled to one terminal of the electrical fuse, and a second terminal electrically coupled to a reference voltage.

10. The circuit of claim 1,
    wherein the logic gate comprises an OR gate having an output and an input coupled to an output of the sense circuit;

wherein the circuit further comprises an inverter having an input coupled to the output of the OR gate; and wherein the stabilization circuit comprises:
 a transistor having a control terminal coupled to the output of the OR gate, a first terminal coupled to a supply voltage, and a second terminal coupled to the operation node.

11. The circuit of claim 10, wherein the stabilization circuit further comprises:
 two inverters coupled in series between the control terminal of the transistor and the output of the OR gate.

12. The circuit of claim 11, further comprising:
 a selection circuit configured for generating a selection signal activating or deactivating a sense current flowing through the fuse cell in response to a first control signal, a data signal and a logic signal corresponding to the sense signal.

13. The circuit of claim 12, wherein the fuse cell comprises:
 a transistor having a control terminal configured for receiving a control signal, a first terminal electrically coupled to one terminal of the electrical fuse, and a second terminal electrically coupled to a reference voltage.

14. A method comprising:
 generating a sense signal indicative of a programmed condition of an electrical fuse in a fuse cell, at an output of a sense circuit;
 performing a logic operation of the sense signal and a control signal to generate a logic signal; and
 in response to the logic signal, sustaining a voltage of an operation node at which the sense circuit is electrically coupled to the fuse cell and data stored in the fuse cell is reflected, during a read operation of the fuse cell.

15. The method of claim 14, wherein the operation of sustaining a voltage of the operation node comprises:
 pulling the operation node up to a supply voltage.

16. The method of claim 14, wherein the operation of sustaining a voltage of the operation node comprises:
 switching on a transistor to couple the operation node to a supply voltage.

17. The method of claim 14,
 wherein the operation of performing the logic operation of the sense signal and the control signal comprises performing OR operation of the sense signal and the control signal to generate the logic signal; and
 wherein the operation of sustaining the voltage of the operation node comprises switching on a transistor in response to the logic signal, to couple the operation node to a supply voltage.

18. The method of claim 14,
 wherein the operation of performing the logic operation of the sense signal and the control signal comprises performing OR operation of the sense signal and the control signal to generate the logic signal;
 wherein the operation of sustaining the voltage of the operation node comprises:
 inverting the logic signal to generate a first inverting signal;
 inverting the first inverting signal to generate a second inverting signal; and
 switching on a transistor in response to the second inverting signal, to couple the operation node to a supply voltage.

* * * * *